(12) United States Patent
Kliman et al.

(10) Patent No.: US 6,169,489 B1
(45) Date of Patent: *Jan. 2, 2001

(54) MOTOR WINDING CONTAMINATION DETECTOR AND DETECTION

(75) Inventors: Gerald Burt Kliman, Niskayuna, NY (US); Robert Henry Rehder, Peterborough (CA)

(73) Assignee: General Electric Company, Schenectady, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/167,343

(22) Filed: Oct. 7, 1998

(51) Int. Cl.[7] .................................................. G08B 21/00
(52) U.S. Cl. .......................... 340/648; 340/635; 340/679; 324/127
(58) Field of Search .................................. 340/648, 649, 340/652, 653, 679, 681, 682, 664, 635; 361/23, 31, 45, 93.1, 93.6; 324/509, 510, 117 R, 127

(56) References Cited

U.S. PATENT DOCUMENTS

| | | | |
|---|---|---|---|
| 5,223,789 | * 6/1993 | Katsuyama et al. ................. | 324/127 |
| 5,514,978 | 5/1996 | Koegl et al. .......................... | 324/772 |
| 5,534,854 | * 7/1996 | Bradbury et al. .................... | 340/648 |
| 5,541,800 | * 7/1996 | Misencik ............................... | 361/45 |
| 5,629,870 | * 5/1997 | Farag et al. .......................... | 340/679 |
| 5,767,780 | * 6/1998 | Smith et al. .......................... | 340/648 |

FOREIGN PATENT DOCUMENTS

| | | |
|---|---|---|
| 3603740 | 2/1986 | (DE) . |
| 8075810 | 3/1996 | (JP) . |

OTHER PUBLICATIONS

J. Gordon, et al. "The Dempster–Shafer Theory of Evidence", Rule–Based Expert Systems: The MYCIN Experiments of the Stanford Heuristic Programming Project, Buchanan and Shortliffe, ed, 1984, pp. 529–539.

R. Patterson, "Signatures and Software Find High Impedance Faults", *IEEE Computer Applications in Power*, Jul. 1995, pp. 12–15.

"DFM Relay With Overcurrent", *IEEE Computer Applications in Power*, Jul. 1995, pp. 51–52.

"Summarizing the Digital Feeder Monitor Arc Detection Algorithm", I. Haimowitz, GE Corporate R&D, Jun. 1996, pp. 1–3.

C.L. Benner, "High Impedance Fault Detection Seminar, General Electric Digital Feeder Monitor" DFM Seminar Overheads, 1995.

Yazici, B., Kliman, G.B., Premerlani, W.J., Koegl, R.A., Robinson, G.B., and Abdel–Malek, A., "An Adaptive On–line Statistical Method for Bearing Fault Detection Using Stator Current," in Proceedings of the IEEE/IAS Industry Applications Society Annual Meeting, New Orleans, Louisiana, Oct. 5–9, 1997.

* cited by examiner

Primary Examiner—Daniel J. Wu
Assistant Examiner—Van T. Trieu
(74) Attorney, Agent, or Firm—Marvin Snyder; Douglas E. Stoner

(57) ABSTRACT

A method and apparatus for detecting motor contamination utilizes zero-sequence currents in a sensing coil to detect contamination. The detector includes a current transformer comprised of a magnetic core and a sensing coil wound about the core. A processor processes a sub-trip level current from the sensing coil to detect contamination. Three contamination detection methods, which may be used separately or in desired combination, are based on current trends, current leakage, and current clustering. An alarm is triggered when predetermined alarm criteria have been met.

4 Claims, 2 Drawing Sheets

MOTOR WINDING CONTAMINATION DETECTOR AND DETECTION

FIELD OF THE INVENTION

This invention relates generally to the field of detecting motor conditions, and more particularly to detecting motor contamination conditions.

BACKGROUND OF THE INVENTION

When dust or other contaminants—especially combined with high humidity—build up on the windings of high voltage machines, the electric field distributions may be distorted to the point of breakdown between sections of the winding or connections at different voltages. With downsized maintenance organizations, cleaning of the windings is often neglected, leading to problems of this nature.

Ground fault detectors are often employed to trip a machine when significant current flows to ground due to actual insulation failure. Otherwise PDA (Partial Discharge Analysis) may be used to detect the presence of contamination, but very special (and usually expensive) instrumentation is needed.

It would be desirable to provide a low cost, on-line, continuous monitor that can be integrated into normal motor protection relays that will warn of dangerous levels of contamination so that action may be taken to clean the windings as needed.

SUMMARY OF THE INVENTION

The invention herein disclosed relates to a motor winding contamination detector which includes a current transformer comprising a magnetic core and a sensing coil wound about the magnetic core. The motor phase leads pass through a window of the core. The detector also includes processing means to process a sub-trip level current from the sensing coil to detect at least one of: a trend contamination signature, a leakage contamination signature, and a clustering contamination signature. An alarm is generated when predetermined alarm generation criteria have been met, the alarm generation criteria being functions of at least one of the contamination signatures. The zero sequence current is used as an indicator of currents flowing to ground as a result of contamination of the windings

DETAILED DESCRIPTION OF THE INVENTION

Figure 1:
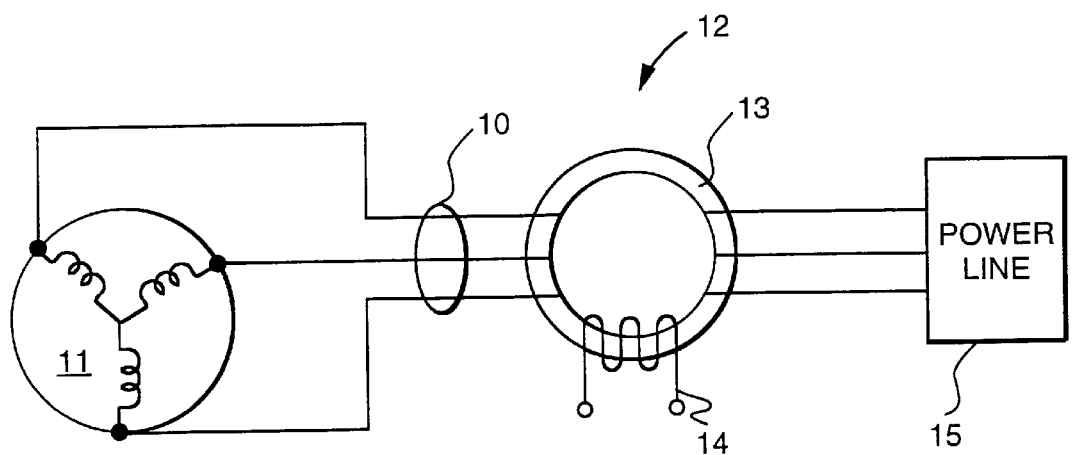
FIG. 1 is a schematic illustration of the contamination detector of the invention.
Figure 2:
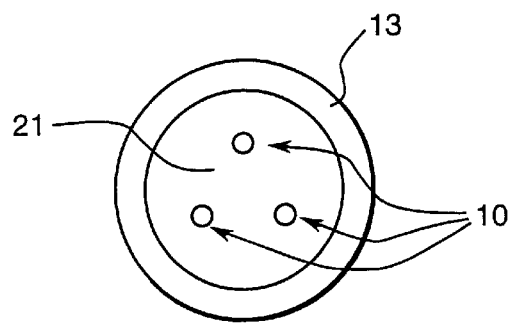
FIG. 2 is an illustration showing proper placement of the three phase leads within the detector core window of FIG. 1.

Superficially, the contamination detector of the invention may look like a ground fault detector based on line currents. As shown in FIG. 1, all three phase leads 10 between motor 11 and power line 15 are brought through the window of current transformer 12 comprising magnetic core 13 and sense coil 14. As long as there is no current flowing to ground there will be no flux induced in core 13 and no signal will appear on sense coil 14. Since detecting contamination requires much greater sensitivity than detecting a ground fault, care must be taken to place leads 10 symmetrically within window 21 of core 13, and not too close to core 13, as shown in FIG. 2.

For ordinary fault detection, the signal from sense coil 14 is used to trip a circuit breaker when a predetermined level of ground current is exceeded. According to the invention, however, it is desired that motor 11 remain protected and energized, but that a contamination warning be given when a contamination situation is detected. Hence the conventional ground fault trip level is retained at normal levels for real faults, but sub-trip current from coil 14 is further processed by a processor 16 and examined closely for contamination signatures which are used to trigger an alarm 304.

Figure 3:
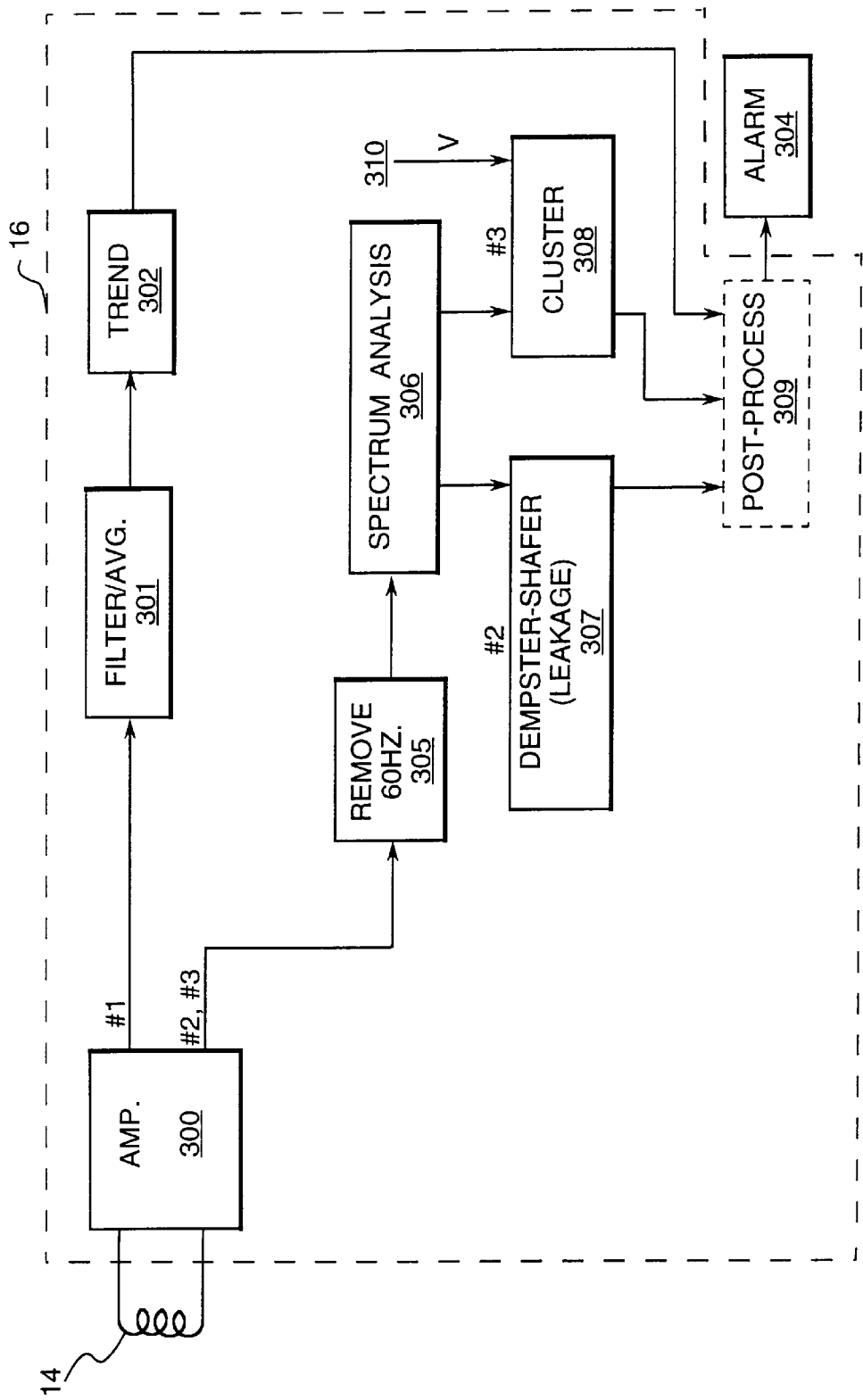
FIG. 3 is a flowchart illustrating how the detector signal is processed to detect contamination.
Figure 1:
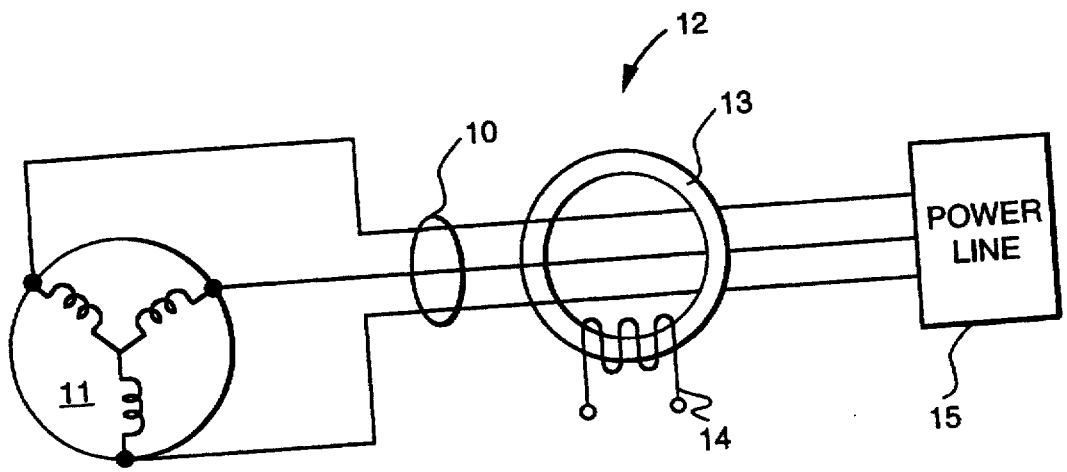
Figure 2:
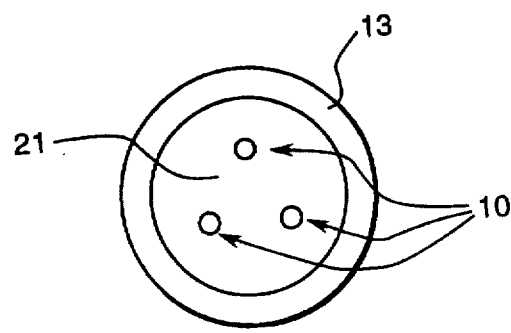

For sub-trip contamination current, the sense coil signal is processed differently than for ground faults. Three processing methods, indicated by #1, #2 and #3 in FIG. 3, are employed independently, or in desired combination. In all methods, the current in sense coil 14 is first amplified 300 prior to further processing.

The first (level and rise) method is simply to look for smaller currents, with greater sensitivity, but taking much more time. Although detection speed is slower, this does not pose a problem, as the rapid detection speeds required for ground faults are not of concern for contamination. This may be done by a variety of filtering and averaging techniques 301 to improve the signal-to-noise ratio, and by trending 302 the resulting output signal level. Then, a functional combination of predetermined absolute level and rate of rise criteria may be used to initiate a contamination alarm 304.

The second and third methods depend on first separating out the (60 Hz.) line frequency component 305 to improve dynamic range and examining the spectrum of the remaining signal 306 using high gains. The resulting signal, due to a sub-critical leakage path, will be intermittent and noisy in a manner somewhat similar to arcing faults. Hence, in the second (contamination) method, application of the Dempster-Shafer algorithm 307—or a similar function of intermittency and noise—may be used, as in the Digital Feeder Monitor (DFM), to generate alarm 304. (See, e.g., Gordon, J. and Shortliffe, E. H., *The Dempster-Shafer Theory of Evidence,* in "Rule-Based Expert Systems: The MYCIN Experiments of the Stanford Heuristic Programming Project," Buchanan, G. G. and Shortliffe, E. H., ed., Addison Wesley, 1984. The Digital Feeder Monitor (DFM), a high-impedance fault detection and monitoring system, is a product of General Electric (GE) Power Management Department, Malvern, Pa.)

Alternatively, in the third (clustering) method, normal patterns of low level ground current noise spectra may be learned, via a clustering process 308 as in bearing deterioration monitoring and broken bar detection. (See, e.g., Yazici, B., Kliman, G. B., Premerlani, W. J., Koegl, R. A., Robinson, G. B., and Abdel-Malek, A., *An Adaptive On-line Statistical Method for Bearing Fault Detection Using Stator Current,* in "Proceedings of the IEEE/IAS Industry Applications Society Annual Meeting," New Orleans, La., Oct. 5–9, 1997.) The appearance of patterns or clusters outside of the normal or baseline patterns or clusters, based on a predetermined functional relationship between normal and observed patterns, may then be used to initiate alarm 304. Since the actual voltage applied to the windings will affect the nature of the discharges, the normal states may be mapped as a function of voltage V (310) as in a turn-to-turn fault detector. (See, e.g., commonly-invented, commonly-assigned U.S. Pat. No. 5,514,978.)

Since only signals of frequency under 1 kHz need be examined to detect contamination, conventional current and potential transformers may be employed. In fact the invention can be implemented as an "add-on" to an existing ground fault detectors, for lowest cost.

The three methods of signal processing disclosed above can be used independently of one another to generate alarm 304. Alternatively, these methods can produce input signals to a post-processing algorithm 309 which initiates alarm 304 as a function of detection information acquired from two, or all three, of these methods.

The invention may be integrated, for example, as a feature of digital motor production relays.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A motor winding contamination detector, comprising:
   a current transformer comprising a magnetic core and a sensing coil wound about said magnetic core, wherein phase leads of a motor for which winding contamination is to be detected pass through a window of said core;
   processing means to process a sub-trip level current from said sensing coil to detect a leakage contamination signature, said processing means comprising:
      amplification means for amplifying said sub-trip level current into an amplified current;
      separation means for removing a line frequency component from said amplified current so as to result in a dynamically-improved current;
      spectral analysis means for providing a current spectral analysis of said dynamically-improved current using high gains; and
      leakage detection and determination means to detect and determine whether said current spectral analysis meets predetermined leakage contamination criteria which are functions of intermittency and noise in said current spectral analysis, so that a leakage contamination signature is detected when said predetermined leakage contamination criteria are met; and
   alarm means for generating an alarm when predetermined alarm generation criteria have been met, said alarm generation criteria being functions of at least one of the contamination signatures.

2. The detector of claim 1, wherein said phase leads of said current transformer are situated symmetrically within said window of said core.

3. A method for detecting contamination in a motor winding, comprising the steps of:
   passing phase leads of a motor for which winding contamination is to be detected, through a window of a magnetic core;
   winding a sensing coil about said magnetic core;
   processing a sub-trip level current from said sensing coil to detect a leakage contamination signature, wherein said processing comprises:
      amplifying said sub-trip level current into an amplified current;
      removing a line frequency component from said amplified current so as to result in a dynamically-improved current;
      providing a current spectral analysis of said dynamically-improved current using high gains; and
      detecting and determining whether leakage in said current spectral analysis meets predetermined leakage contamination criteria which are functions of intermittency and noise in said current spectral analysis, so that a leakage contamination signature is detected when said predetermined leakage contamination criteria are met; and
   generating an alarm when predetermined alarm generation criteria have been met, said alarm generation criteria being functions of at least one of the contamination signatures.

4. The method of claim 3, wherein the step of passing phase leads of a motor through a window of a magnetic core includes the step of situating said phase leads symmetrically within said window of said core.

* * * * *

UNITED STATES PATENT AND TRADEMARK OFFICE
CERTIFICATE OF CORRECTION

PATENT NO. : 6,169,489 B1  
DATED : January 2, 2001  
INVENTOR(S) : Gerald B. Kliman and Robert H. Rehder Page 1 of 2

It is certified that error appears in the above-identified patent and that said Letters Patent is hereby corrected as shown below:

Column 3,  
Line 2, the word "an" (second occurrence) should de deleted;

Drawings,  
Sheet 1, figure 1, all three phase leads 10 should not terminate at core 13, but should pass through the center window in the core and extend in complete continuity between motor 11 and power line 15.

Signed and Sealed this

Twenty-ninth Day of January, 2002

Attest:

*Attesting Officer*

JAMES E. ROGAN  
*Director of the United States Patent and Trademark Office*